(12) United States Patent
Van Geloven et al.

(10) Patent No.: US 6,219,270 B1
(45) Date of Patent: Apr. 17, 2001

(54) INTEGRATED CIRCUIT HAVING DYNAMIC MEMORY WITH BOOSTED PLATELINE

(75) Inventors: Johannes A. J. Van Geloven; Cornelis G. L. M. Van Der Sanden, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/316,558

(22) Filed: May 24, 1999

(51) Int. Cl.[7] ..................................................... G11C 11/24
(52) U.S. Cl. ................ 365/149; 365/189.09; 365/230.06
(58) Field of Search ............................... 365/149, 189.09, 365/189.11, 129, 189.01, 230.06, 230.01

(56) References Cited

U.S. PATENT DOCUMENTS

| | | | |
|---|---|---|---|
| 5,317,532 | * | 5/1994 | Ochii ........................................ 365/149 |
| 5,532,953 | * | 7/1996 | Ruesch et al. ......................... 365/145 |
| 5,694,355 | * | 12/1997 | Skjaveland et al. .................. 365/149 |
| 5,870,329 | * | 2/1999 | Foss ....................................... 365/149 |

\* cited by examiner

*Primary Examiner*—David Nelms
*Assistant Examiner*—Hoai V. Ho
(74) *Attorney, Agent, or Firm*—Steven R. Biren

(57) ABSTRACT

An integrated circuit has a matrix of memory cells with a capacitive element and an access transistor. A plate conductor is connected to terminals of the capacitive element of all the memory cells. A voltage boost circuit boosts a voltage of the plate conductor to a voltage level outside a power supply range of the integrated circuit. A switching element is connected between the plate conductor and a control electrode of the access transistor. Thus the access transistor is controlled with the voltage of the plate conductor. Preferably, the voltage of the plate conductor is boosted below Vss and at a level regulated relative to Vdd.

6 Claims, 2 Drawing Sheets

US 6,219,270 B1

INTEGRATED CIRCUIT HAVING DYNAMIC MEMORY WITH BOOSTED PLATELINE

FIELD OF THE INVENTION

The invention relates to an integrated circuit with a matrix of dynamic memory cells.

BACKGROUND OF THE INVENTION

Dynamic memory stores information as charge in a memory capacitor. In embedded memory (memory included in an integrated circuit with logic circuits, usually for storing data for specific logic functions) the memory capacitor is often implemented as a field effect transistor, the control electrode of this transistor forming one terminal of the capacitor and the drain and source of this transistor forming the other terminal of the capacitor.

Charge is supplied to the capacitor via an access transistor. When information is written the access transistor connects one of the terminals to the positive supply voltage or to the negative supply voltage, dependent on the information value that must be written. The other terminal of the capacitor is kept in connection with a plate conductor, which is at a substantially fixed voltage level.

The retention time of this information is limited by leakage currents, which over time efface the difference between charges that are used to represent different information values. The retention time can be improved by increasing the charge difference between the different charges that represent different information values.

The charge difference is limited amongst others by a threshold voltage drop across the access transistor. In case a field effect transistor is used as capacitor, the charge difference is also limited the minimum charge that is required to keep the channel of this field effect transistor conductive.

It is known to boost the voltage at the plate conductor so that the field effect transistor operates as a capacitor over a wider voltage range, thus increasing the charge difference. It is also known to boost a voltage at the control electrode of the access transistor outside a supply voltage range of the memory. This has the effect of overcoming the threshold voltage drop, thus also increasing the charge difference.

Boosting the voltage at the control electrode of the access transistor requires a strong and fast access transistor control circuit. The speed with which the control electrode can be driven strongly influences the access speed of the memory. Usually the control electrodes of a row of access transistors in a memory matrix are driven in parallel. This means that the access transistor control circuit must be able to drive the control electrodes of a row of access transistors quickly. As a result, the access transistor control circuit may be quite large.

SUMMARY OF THE INVENTION

Amongst others, it is an object of the invention to provide for an integrated circuit with a memory that requires a small control circuit for the control electrode of the access transistors.

The integrated circuit according to the invention has a switching element connected between the control electrode of the access transistor and the cell plate conductor. The cell plate conductor is connected to the capacitors of a matrix of memory cells. The voltage of the cell plate conductor is boosted. When the switching element is made conductive, the control electrode of the access transistor is driven from the cell plate conductor. This is a very strong driver, because the cell plate conductor has a large capacitance from which to draw charge for the control gate of the access transistor. The capacitance of the cell plate conductor is large because of the size of the cell plate conductor needed to connect all the capacitors and because of the large number of capacitors of the matrix connected to the cell plate conductor.

In an embodiment of the integrated circuit according to the invention a PMOS transistor is used as access transistor. In this embodiment, the voltage of the plate conductor is boosted below the negative power supply voltage. This means that the PMOS transistor will remain conductive even if the voltage supplied to its main current channel is at the negative power supply level. In this embodiment, the voltage of the plate conductor is regulated relative to the positive power supply voltage, so that the difference between the voltage of the plate conductor and the positive power supply voltage is substantially independent of the difference between the positive and negative power supply voltages.

The integrated circuit has to be able to work with a supply voltage difference in a standard tolerance range. The voltage of the plate conductor has to be limited so that the gate oxide of the PMOS access transistor does not break down at any position in the tolerance range. If the difference between the negative supply voltage and the voltage of the plate conductor were fixed, this would mean that this difference should be quite small, so as to account for the highest possible positive supply voltage in the tolerance range. As a result, there would be little improvement when the positive supply voltage is at the minimum of the tolerance range.

By regulating the voltage difference between the voltage of the plate conductor and the positive supply voltage to a supply voltage independent value, a bigger improvement can be realized over the entire supply tolerance range. In this case the maximum acceptable voltage difference between the plate conductor and the positive supply can be used over the entire supply tolerance range.

BRIEF DESCRIPTION OF THE DRAWINGS

These and other advantageous aspects of the integrated circuit according to the invention will be described with reference to the following figures.

DESCRIPTION OF THE PREFERRED EMBODIMENTS

Figure 1:
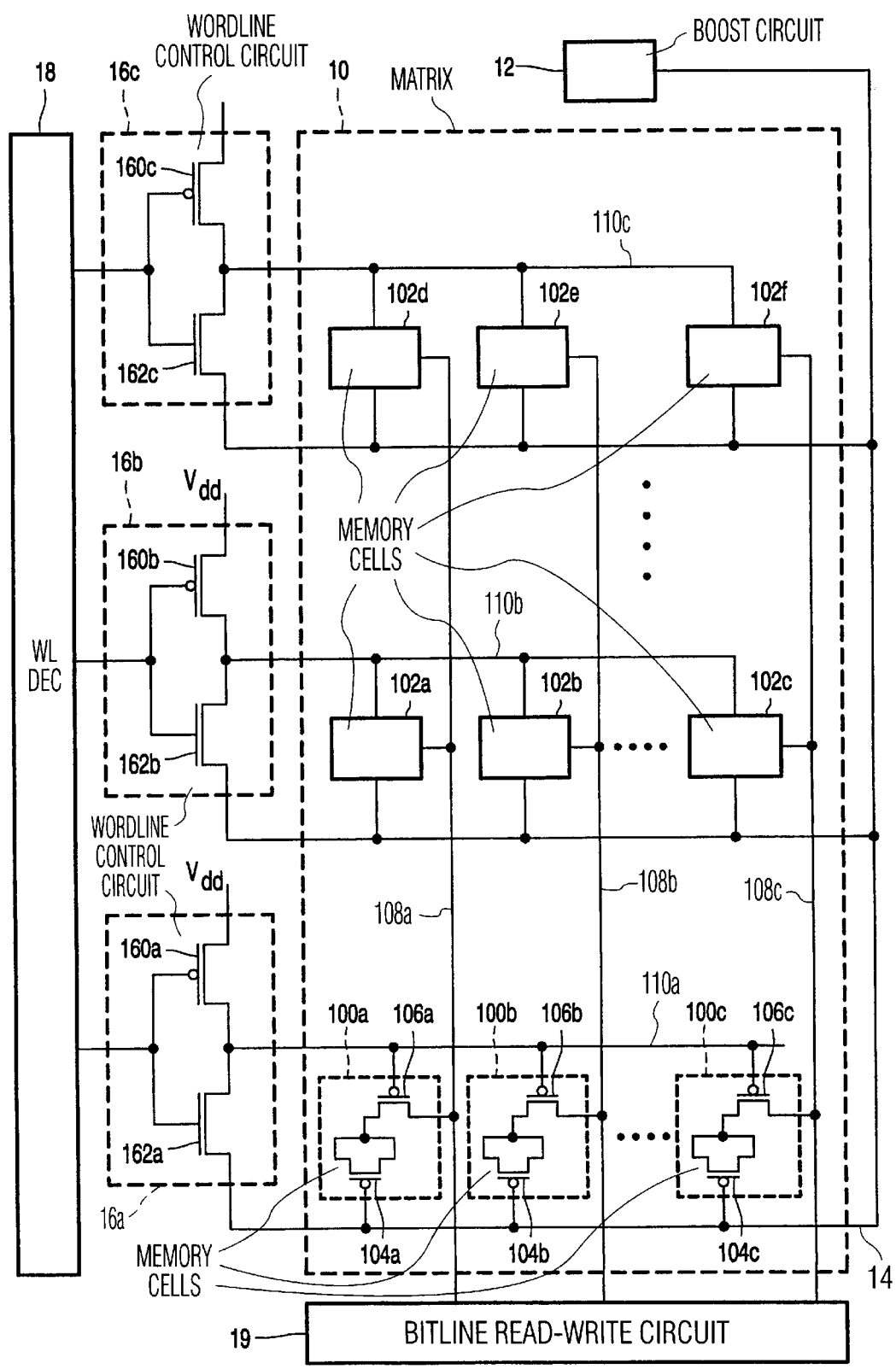
FIG. 1 shows a memory circuit

FIG. 1 shows a memory circuit with a matrix 10 of memory cells 100a–c, 102a–f, a boost circuit 12, word line control circuits 16a–c, word line address decoder 18 and bitline read/write circuit 19.

The matrix 10 contains a number of rows and columns of memory cells 100a–c, 102a–f, only some of which are show explicitly for the sake of clarity. The matrix 10 contains bitlines 108a–c, word lines 110a–c and a plateline 14. All memory cells 100a–c, 102a–f are connected to the plateline 14. The boost circuit 12 drives the plateline. A respective wordline 110a–c is provided for each row. In each row all memory cells 100a–c, 102a–f of the row are connected to the wordline 110a–c for the row. A respective bitline 108a–c is provided for each column. In each column all memory cells 100a–c, 102a–f of the column are connected to the bitline 108a–c for the column. The bitlines 108a–c are connected to the bitline read/write circuit 19.

Each memory cell 100a–c, 102a–f contains a capacitive element 104a–c, and an access transistor 106a–c. By way of example, each capacitive element 104a–c is shown as a PMOS transistor 104a–c, the source and drain of the PMOS transistor 104a–c forming a first terminal of the capacitive element, the gate of the PMOS transistor 104a–c forming a second terminal of the capacitive element. The channel of the access transistor 106a–c (also PMOS) is connected between the first terminal of the capacitive element 104a–c and the bitline 108a–c of the column to which the memory cell 100a–c, 102a–f belongs. The second terminal of the capacitive element 104a–c is connected to the plate line 14, in common with the second terminal of the capacitive elements 104a–c of all other memory cells 100a–c, 102a–f.

The word lines 110a–c, the bit lines 108a–c and the plate line 14 are all electrical conductors, such as metal or polysilicon tracks on an integrated circuit.

The word line address decoder 18 has outputs coupled to respective ones of the word line control circuits 16a–c. There is a respective word line control circuit 16a–c associated with each row of the matrix. Each word line control circuit 16a–c is connected to the word line 110a–c of its associated row.

All word line control circuits 16a–c are connected to the plate line 14. Each word line control circuit contains a first (NMOS) and second (PMOS) transistor 160a–c, 162a–c. The gates of the first and second transistor 160a–c, 162a–c are coupled together and to the output of the row address decoder 18. The main current channel of the first transistor 160a–c is coupled between the plate line 14 and the word line 110a–c of the row associated with the wordline control circuit 16a–c. The main current channel of the second transistor is coupled between the positive power supply connection Vdd and the word line 110a–c of the row associated with the wordline control circuit 16a–c.

In operation, the boost circuit boosts the plate line to a level of for example 1.2 Volt below the voltage of the negative power supply terminal Vss.

When the memory writes data into cells, the bitline read/write circuit applies logic signals to the bitlines 108a–c. The logic signals correspond to a voltage of substantially VDD (the positive supply voltage) or VSS (the negative supply voltage) for example. The word line address decoder 18 receives a wordline address, decodes the word line address and selects one row of the matrix 10 according to the word line address. The address decoder 18 activates the word line control circuit 16a–c for the wordline selected row.

In the activated wordline control circuit 16a–c the first transistor 160a–c is made conductive and the second transistor 162a–c is made non-conductive. As a result the plate line 14 is electrically connected to the word line 110a–c of the selected row. This wordline 110a–c will be charged from the plateline 14. Due to the large capacitance of the plateline 14, the voltage of the plateline 14 will hardly rise due to this charging (the capacitance is large because the plateline runs through the entire matrix 10 and is connected to all memory cells 100a–c, 102a–f).

As a result, the word line 110a–c of the selected row reaches a boosted voltage level of the plateline 14. This enables the access transistor 106a–c of the memory cells 100a–c, 102a–f in the selected row to bring the first terminal of the capacitive element 104a–c of the memory cell 100a–c, 102a–f at substantially the same voltage level as the associated bitline 108a–c. That is, there is no threshold voltage drop across the access transistor 106a–c, even if the bit line 108a–c is at the negative power supply voltage Vss. Thus the difference between the charge supplied to the capacitive elements 104a–c for different logic levels is maximal.

Of course, this effect occurs independent of whether the capacitive element 104a–c is implemented as a transistor or otherwise, for example as a capacitor made of separated conductors. In both cases the large capacitance of the plate line serves to provide a stable strong drive source for driving the word lines 110a–c. If the capacitive elements 104a–c are implemented as transistors, the boost circuit 12 also serves to increase the voltage range over which the transistors 104a–c operate as capacitors.

In the wordline control circuits 16a–c other than the activated wordline control circuit 16a–c, the first transistor 160a–c is kept non-conductive and the second transistor 162a–c is kept conductive. As a result the wordlines 110a–c of the unselected rows are kept at the voltage of the positive power supply terminal Vdd. The access transistors 106a–c connected to those word lines will remain non-conductive and the charge in the capacitive elements of the memory cells 100a–c, 102a–f will remain unchanged.

Figure 2:
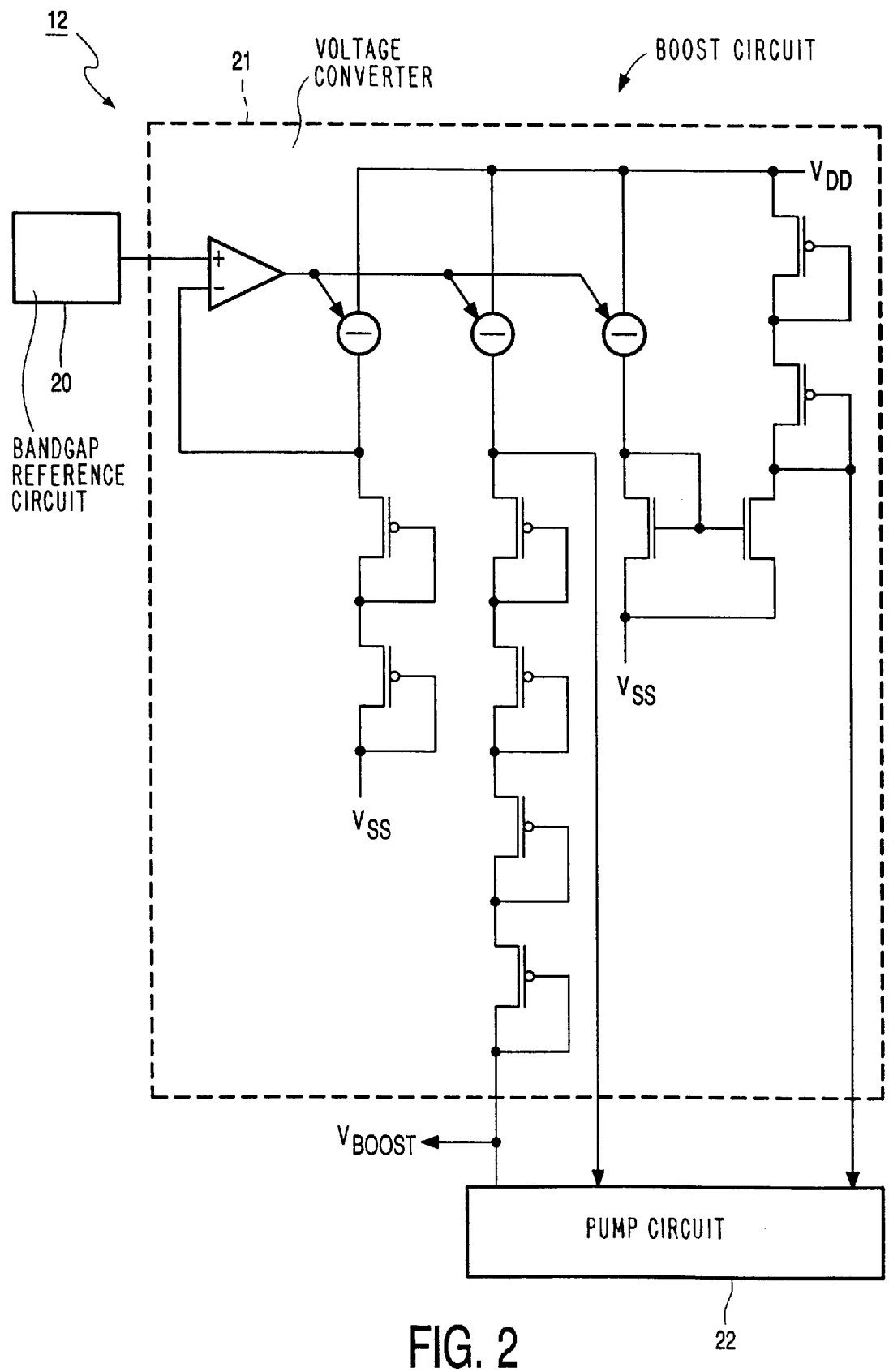
FIG. 2 shows a boost circuit.

FIG. 2 shows a boost circuit 12. The boost circuit 12 contains a bandgap reference circuit 20, a voltage converter 21 and a pump circuit 22. A reference output of the bandgap reference circuit 20 is coupled to an input of the voltage converter. Outputs of the voltage converter 21 are coupled to the pump circuit 22. An output of the pump circuit is fed back to the voltage converter 21.

In operation, the bandgap reference circuit produces an output voltage Vb that is approximately 1.2 Volt above the negative power supply voltage Vss. The voltage converter uses this voltage Vb and an output voltage Vboost of the pump circuit 22 to generate converted voltages Vdd–Vb and Vboost+2Vb (where Vdd is the positive power supply voltage). The pump circuit 22 receives the output voltages of the converter circuit and regulates its output voltage Vboost, so that its input voltages Vdd–Vb and Vboost+2Vb become equal, that is so that Vboost=Vdd–3*Vb. Vdd is typically 2.7 Volt above the negative power supply voltage Vss, so that $$Vboost=-0.9 \text{ Volt}$$

When a different positive power supply voltage Vdd is supplied to the circuit, Vboost will vary with Vdd. As a result, the voltage across the gate-channel separation of the access transistor 106a–c and the capacitive element 104a–c is substantially independent of the power supply voltage Vdd–Vss.

Of course, the specific choice of an output voltage for the boost circuit of FIG. 2 depends on the maximum tolerable voltage across the gate-channel separation of the access transistor 106a–c and the capacitive element 104a–c. If a higher or lower voltage is required, Vboost–Vdd should be regulated to a higher or lower value.

The measure of keeping the voltage of the plate line 14 at a fixed distance from the positive power supply Vdd is also advantageous when the word line control circuits 16a–c do not connect the word lines 110a–c to the plate line 14. In this case, this measure ensures that the transistors 104a–c that implement the capacitive elements do not break down when a different supply voltage Vdd–Vss is used, and that a maximum operating range is available for the capacitive elements 104a–c over the entire supply voltage tolerance range.

Of course, the invention is not limited to the boost circuit 12 shown in FIG. 2. Various alternatives are available to the skilled person. For example, one may use a regulating circuit which regulates the difference between a measured voltage and a reference voltage to zero, where the measured voltage is obtained with a voltage divider connected between the positive power supply Vdd and Vboost (e.g. a 1:3 divider so that the divider output voltage is Vdd+(Vboost−Vdd)/3. In this case, the reference voltage may be obtained for example with a bandgap reference that operates relative to the positive power supply Vdd, to produce a reference voltage Vdd−Vb.

What is claimed is:

1. An integrated circuit comprising:
    a matrix of memory cells, each memory cell comprising a capacitive element, an access transistor and a cell input, a main channel of the access transistor being connected between the cell input and a first terminal of the capacitive element;
    a plate conductor, a second terminal of the capacitive element of each of the memory cells being connected to the plate conductor;
    a voltage boost circuit connected to the plate conductor, for boosting a voltage of the plate conductor to a voltage level outside a power supply range of the integrated circuit;
    an access transistor control circuit, comprising a switching element connected between the plate conductor and a control electrode of the access transistor of at least one of the memory cells, for controlling the access transistor with the voltage of the plate conductor.

2. The integrated circuit according to claim 1, the memory cells being grouped in rows and columns, each row comprising a row conductor connected to the control electrode of the access transistor of each memory cell in the row, the switching element being connected between the plate conductor and the row conductor of one of the rows.

3. The integrated circuit according to claim 1, the access transistors and the capacitive elements being realized as PMOS transistors, the boost circuit regulating the voltage of the plate conductor relative to a maximum positive supply voltage applied to the main channel of the access transistor, a substantially supply voltage independent voltage difference being maintained between the maximum positive supply voltage and the voltage of the plate conductor.

4. The integrated circuit according to claim 1, the boost circuit comprising a band gap reference circuit as a reference for regulating said voltage difference.

5. An integrated circuit comprising:
    a matrix of memory cells, each memory cell comprising a capacitive data storage element realized as a PMOS transistor having a main current channel and a gate, forming a first and second terminal of the capacitive data storage element respectively,
    a plate conductor, said second terminal of the capacitive element of each of the memory cells being connected to the plate conductor;
    a voltage boost circuit connected to the plate conductor, for boosting a voltage of the plate conductor to a voltage level outside a power supply range of the integrated circuit, the boost circuit regulating the voltage of the plate conductor relative to a maximum positive supply, voltage applied to the main current channel of the transistor, a substantially supply-voltage-independent voltage difference being maintained between the maximum positive supply voltage and the voltage of the plate conductor.

6. A integrated circuit comprising:
    a PMOS access transistor having a main current channel coupled between the first terminal of the capacitive element and an input of the memory cell, a gate of the PMOS access transistor being coupled to an output of the voltage boost circuit.

* * * * *